(12) United States Patent
Lee et al.

(10) Patent No.: US 10,103,715 B2
(45) Date of Patent: Oct. 16, 2018

(54) METHOD OF LAYING OUT A SEMICONDUCTOR DEVICE BASED ON SWITCHING ACTIVITY AND SEMICONDUCTOR DEVICE PRODUCED THEREBY

(71) Applicant: SAMSUNG ELECTRONICS CO., LTD., Suwon-si, Gyeonggi-Do (KR)

(72) Inventors: Taehee Lee, Suwon-si (KR); Joon-Sung Yang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/701,110

(22) Filed: Sep. 11, 2017

(65) Prior Publication Data

US 2018/0131351 A1 May 10, 2018

(30) Foreign Application Priority Data

Nov. 7, 2016 (KR) .................. 10-2016-0147685

(51) Int. Cl.
| | |
|---|---|
| *H01L 25/00* | (2006.01) |
| *H03K 3/012* | (2006.01) |
| *G06F 17/50* | (2006.01) |
| *H03K 3/037* | (2006.01) |

(52) U.S. Cl.
CPC .......... *H03K 3/012* (2013.01); *G06F 17/505* (2013.01); *G06F 17/5081* (2013.01); *H03K 3/037* (2013.01)

(58) Field of Classification Search
CPC ................. G06F 1/10; H01L 27/0207; H01L 2924/3011; H01L 27/11898; H01L 23/50

USPC .......................................... 327/565; 716/119
See application file for complete search history.

(56) References Cited

U.S. PATENT DOCUMENTS

| | | | |
|---|---|---|---|
| 7,257,782 B2 | 8/2007 | Ho et al. | |
| 7,546,559 B2 | 6/2009 | Kapoor et al. | |
| 8,566,658 B2 | 10/2013 | Tekumalla et al. | |
| 8,661,374 B2 | 2/2014 | Vishweshwara et al. | |
| 8,704,577 B2 | 4/2014 | Taskin et al. | |
| 8,788,896 B2 | 7/2014 | Tekumalla | |
| 2011/0283248 A1* | 11/2011 | Irie ..................... | G06F 17/5068 716/120 |
| 2012/0221992 A1* | 8/2012 | Okabe ................. | G06F 17/5068 716/113 |
| 2013/0194016 A1 | 8/2013 | Wimer | |
| 2016/0049937 A1 | 2/2016 | Tong et al. | |
| 2017/0053057 A1* | 2/2017 | Riviere-Cazaux .......................... | G03F 7/70433 |

* cited by examiner

*Primary Examiner* — Quan Tra
(74) *Attorney, Agent, or Firm* — Volentine, Whitt & Francos, PLLC

(57) ABSTRACT

A method of laying out a semiconductor device includes arranging a flip-flop in the semiconductor device, and rearranging the flip-flop to a selected location in the semiconductor device. The flip-flop may be configured to receive a clock from a clock gating cell through a clock line, to receive an input signal through an input line, and to output an output signal through an output line. The flip-flop may be rearranged based on a length of the clock line, the number of times the clock line is toggled per reference time, a length of the input line, a length of the output line, and at least one of: the number of times that the input signal is toggled per the reference time, and the number of times that the output signal is toggled per the reference time.

20 Claims, 11 Drawing Sheets

METHOD OF LAYING OUT A SEMICONDUCTOR DEVICE BASED ON SWITCHING ACTIVITY AND SEMICONDUCTOR DEVICE PRODUCED THEREBY

CROSS-REFERENCE TO RELATED APPLICATIONS

This non-provisional U.S. patent application claims priority under 35 U.S.C. § 119 from Korean Patent Application No. 10-2016-0147685, filed on Nov. 7, 2016, the entire contents of which are hereby incorporated by reference.

BACKGROUND

The inventive concept relates to a method of laying out a semiconductor device, and more particularly, to a method of arranging a semiconductor device considering a switching activity of a signal with respect to the semiconductor device.

A semiconductor device may include various logical devices such as an AND gate, a NAND gate, an OR gate, or a NOR gate and various type of flip-flops. The flip-flop receives a clock and an input signal to generate an output signal.

Since a clock is continuously toggled on a reference cycle, power consumption by toggling of the clock is large. Thus, by moving the flip-flop close to a clock gating cell which outputs the clock, the power consumption by the clock may be reduced. However, this may cause an increase of a distance between the flip-flop and a device which receives an output signal from the flip-flop. That is, power consumption by toggling of the output signal of the flip-flop may increase.

Therefore, it is desirable to arrange elements constituting a semiconductor device in consideration of various factors capable of reducing not only toggling of the clock but also the power consumption of the semiconductor device.

SUMMARY

Example embodiments of the inventive concept provide a method of laying out a semiconductor device. The method may include arranging in the semiconductor device a flip-flop which is configured to receive a clock from a clock gating cell through a clock line, to receive an input signal through an input line, and to output an output signal through an output line, and rearranging the flip-flop to a location in the semiconductor device based on a length of the clock line, the number of times the clock is toggled per reference time (hereinafter referred to as first switching activity), a length of the input line, a length of the output line, and at least one of: the number of times that the input signal is toggled per the reference time, and the number of times that the output signal is toggled per the reference time (hereinafter referred to as second switching activity).

Example embodiments of the inventive concept provide a semiconductor device. The semiconductor device may include a clock gating cell and a flip-flop configured to receive a clock from the clock gating cell through a clock line, to receive an input signal through an input line, and to output an output signal through an output line. The flip-flop is arranged at a location in the semiconductor device selected based on a length of the clock line, the number of times the clock is toggled per reference time (hereinafter referred to as first switching activity), a length of the input line, a length of the output line, and at least one of: the number of times that the input signal is toggled per the reference time, and the number of times that the output signal is toggled per the reference time (hereinafter referred to as second switching activity).

Other example embodiments of the inventive concept provide a semiconductor device, comprising: a clock gating cell; and a flip-flop configured to receive a clock from the clock gating cell through a clock line, to receive an input signal through an input signal line, and to output an output signal through an output signal line. The flip-flop is disposed at a selected location in the semiconductor device which selected location satisfies all of a set of criteria comprising: the selected location is disposed within a timing slack free region in the semiconductor device, a device density constraint is satisfied for an area of the semiconductor device which includes the selected location, a clock skew constraint for the clock is satisfied, and moving the flip-flop from another location to the selected location satisfies a cost function which considers a length of the clock line, a number of times the clock line is toggled per reference time, a length of the input signal line, a length of the output signal line, and at least one of: a number of times that the input signal is toggled per the reference time, and a number of times that the output signal is toggled per the reference time.

BRIEF DESCRIPTION OF THE DRAWINGS

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
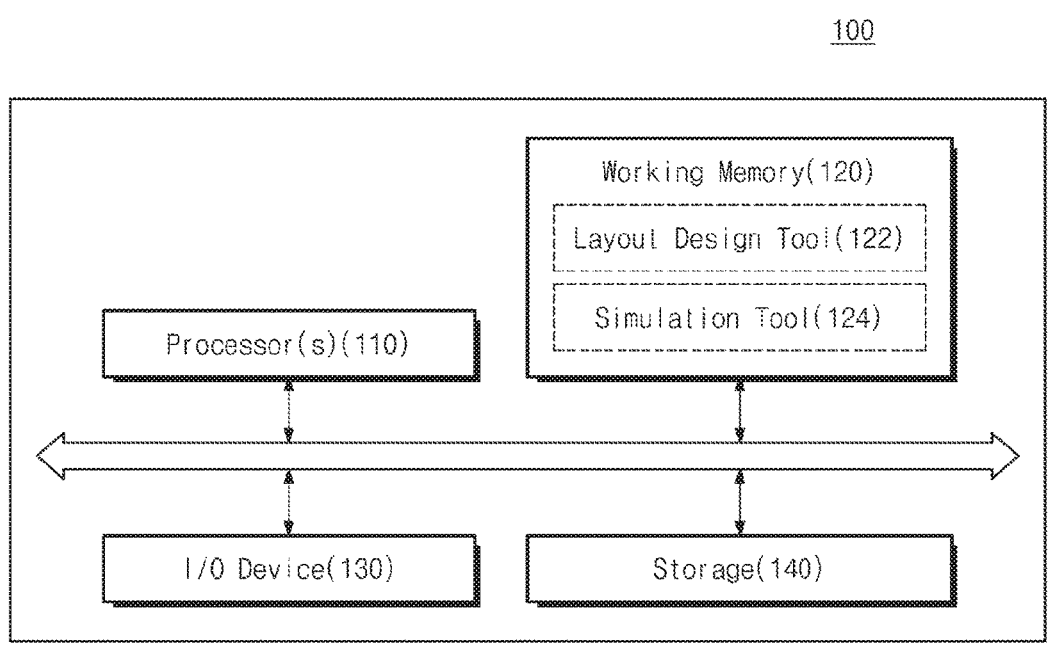
FIG. 1 is a block diagram illustrating a computing system for designing a semiconductor device according to example embodiments.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a computing system for designing a semiconductor device according to example embodiments. Referring to FIG. 1, a computing system 100 may include at least one processor 110, a working memory 120, an input/output device 130, and a storage device 140. In some cases, computing system 100 may be provided as a device only for designing a layout of semiconductor device. However, computing system 100 also may be configured to drive various design and verification simulation programs.

Processor 110 may execute software (e.g., one or more application programs, one or more operating systems, device drivers, etc.) to perform one of more operations or algorithms in computing system 100. Processor 110 may execute an operating system (OS, not shown) loaded into working memory 120. Processor 110 may execute various application programs to be driven based on the operating system. For example, processor 110 may execute a layout design tool 122 loaded into working memory 120.

When computing system 100 is booted, an operating system (OS) image (not shown) stored in storage device 140 may be loaded into working memory 120 according to a booting sequence. All input/output operations of computing system 100 may be supported by the operating system. Similarly, application programs may be loaded into working memory 120 to be selected by a user or to provide a basic service to a user. Layout design tool 122 for a layout design may be loaded from storage device 140 into working memory 120.

Layout design tool 122 may include a biasing function that can change a form and a location of specific layout patterns to be different from things defined by a design tool. Layout design tool 122 may perform a design rule check (DRC) in a changed biasing data condition. Working memory 120 may include a volatile memory such as a static random access memory (SRAM) and/or a dynamic random access memory (DRAM). However, working memory 120 is not limited thereto and may include a nonvolatile memory such as a phase-change RAM (PRAM), a magnetic RAM (MRAM), a resistive RAM (ReRAM), a ferroelectric RAM (FRAM), or a flash memory.

A simulation tool 124 may be further loaded into working memory 120. Simulation tool 124 performs an optical proximity correction (OPC) with respect to the designed layout data.

Input/output device 130 may include various devices that can receive information from a designer or provide information to a designer. For example, a processing operation of simulation tool 124 and a processing result of simulation tool 124 may be displayed through input/output device 130.

Storage device 140 may be provided as a storage medium of computing system 100. Storage device 140 may store application programs, an operating system image, and all sorts of data. For example, storage device 140 may be provided as a solid state drive (SSD), an embedded multimedia card (eMMC), or a hard disk drive (HDD), etc. Storage device 140 may include a NAND flash memory. However, storage device 140 is not limited thereto and may include a nonvolatile memory such as a PRAM, a MRAM, a ReRAM, a FRAM, etc. or a NOR flash memory.

Figure 2:
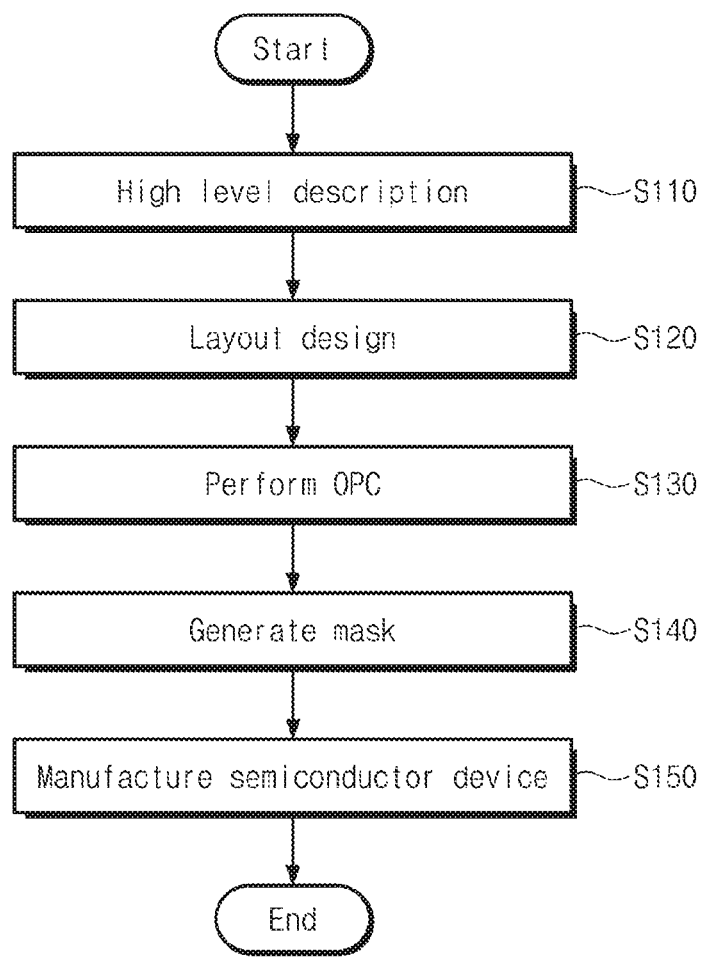
FIG. 2 is a flowchart illustrating a method of designing and manufacturing a semiconductor device according to example embodiments.

FIG. 2 is a flowchart illustrating a method of designing and manufacturing a semiconductor device according to example embodiments.

In an operation S110, a high level design of a semiconductor device may be performed using computing system 100 of FIG. 1. The high level design may mean to describe a design target integrated circuit in a high-level computer language. For example, a high-level language such as C may be used. Circuits designed by a high-level design may be more specifically expressed by a register transfer level (RTL) coding or simulation. Furthermore, a code generated by the RTL coding may be converted into a netlist to be synthesized to the whole semiconductor device. The synthesized schematic circuit may be verified by simulation tool 124 and may be accompanied with an adjustment process depending on a verification result.

In an operation S120, a layout design may be performed to implement a logically completed semiconductor integrated circuit on a silicon substrate. For example, a layout design may be performed with reference to a schematic circuit synthesized in a high-level design, or a netlist corresponding thereto. The layout design may include a routing process which arranges and connects various standard cells provided from a cell library according to a prescribed design rule.

According to a method of manufacturing a semiconductor device in accordance with example embodiments, in the high-level design and the layout design, a switching activity of a logical device may be considered. For example, the switching activity may be defined as an amount of power consumed according to the number of toggles of a signal or a clock per a reference time period. That is, when we say that the switching activity of a signal or a clock is great, we mean that the number of times the signal or the clock is toggled in a reference time period is relatively large, or that relatively large amounts of power is consumed by the toggling.

A clock gating cell may receive a source clock, or a clock from another clock gating cell, and may receive from a controller (not shown) a clock enable signal which enables the clock. A clock may be activated or inactivated by the clock enable signal. A clock which passed through the clock gating cell may be transmitted to another clock gating cell or a sequential cell (e.g., flip-flop). Since the clock gating cell receives or transmits a clock in which a toggle constantly occurs, the length of a clock line connected to the clock gating cell is one of main factors which increase power consumption of a semiconductor device which includes the clock gating cell.

The flip-flop may perform various logical operations using a clock received from the clock gating cell and an input signal received from another logical device. Assume that the flip-flop is located slightly close to the clock gating cell to reduce the length of a clock line which provides a clock which is input from the clock gating cell to the flip-flop. In this case, because of a reduction of the length of the clock line, power consumption by toggling of the clock may be reduced. However, this may cause an increase of a length of a signal line to which an input signal being input to the flip-flop, or an output signal being output from the flip-flop, is transmitted. That is, this may bring about an increase of power consumption caused by toggling of an input/output signal with respect to the flip-flop.

When designing a layout of a semiconductor device, not only power loss caused by toggling of a clock which is input to the flip-flop but also power loss caused by toggling of an input/output signal which is input to the flip-flop or is output from the flip-flop have to be considered together. Adjusting a location (e.g., one of grids) of the flip-flop to reduce power loss caused by toggling of a clock which is input to the flip-flop and power loss caused by toggling of an input/output signal with respect to the flip-flop is referred to herein as a clumping operation.

To facilitate a better understanding, assume that in a clumping operation, the activity of a clock which is input to the flip-flop is two times the activity of an input/output signal with respect to the flip-flop. That is, assume that the number of times the clock is toggled per unit time is two times the number of times the input/output signal is toggled per unit time. Also assume that a signal line of the flip-flop is increased two times while a length of a clock line to which a clock is transmitted is reduced by half by a clumping operation. In this case, a reduction of power consumption caused by a reduction of the length of the clock line and an increase of power consumption caused by an increase of the signal line may cancel each other out. That is, there is no advantage in performing the clumping operation. A change of capacitance component caused by a change of a length of the clock line and the signal line may affect power consumption, but for brevity of description, this effect may be excluded.

Assume that the flip-flop is a multi-bit flip-flop. In the case of performing a clumping operation on a four bit flip-flop, there will be an advantage in performing a clumping operation only if a reduction of power consumption caused by a reduction of the length of the clock line becomes is at least eight times an increase of power consumption caused by an increase of the length of the signal line. This is because in the case of a 4 bit flip-flop, the number of input lines and output lines is 4 respectively.

As described above, according to a method of manufacturing a semiconductor device in accordance with example embodiments, when designing a layout of the semiconductor device, not only activity of the clock but also activity of the input/output signal(s) have to be considered together. A timing slack, a device density, a clock skew, etc. may also be considered.

In operation S120, a cell library to express a specific gate level circuit by a layout is defined in most layout design tools. The layout may be a process of defining a form or a size of a pattern for configuring transistors and conductive lines to be actually formed in a silicon substrate. For example, to form an inverter circuit on a silicon substrate, layout patterns such as PMOS, NMOS, N-WELL, a gate electrode, and conductive lines to be arranged thereon may be properly arranged. To this end, proper items may be searched and selected first among inverters already defined in the cell library. Then a routing may be performed on the selected standard cells. Most these processes may be automatically or manually performed by the layout design tool.

After the routing, a verification operation for a layout may be performed. Examples of the verification operation may include a design rule check (DRC) which verifies whether a layout is designed to suit the design rule, an electronic rule check (ERC) which verifies whether internal elements of a layout are well connected to one another without an electrical disconnection, and a layout vs. schematic (LVS) which verifies whether a layout coincides with a gate-level netlist.

In an operation S130, an optical proximity correction (OPC) may be executed. Layout patterns obtained through a layout design may be implemented on a silicon substrate using a photolithography process. The OPC (optical proximity correction) may be a technology to correct a distortion phenomenon that may occur in a photolithography process. A distortion phenomenon such as refraction or a process effect which occurs due to a light characteristic in its exposure using a layout pattern through the OPC may be corrected. The form and the location of the designed layout patterns may be slightly changed by executing the OPC.

In an operation S140, photomasks may be produced based on the layout changed by the OPC. The photomasks may be generally produced by a method of depicting layout patterns using a chrome thin film spread on a glass substrate.

In an operation S150, a semiconductor device may be manufactured using the produced photomasks. Various types of exposure and etching processes may be repeated in a manufacturing process of a semiconductor device using the photomasks. The form of the patterns configured when designing a layout on a silicon substrate may be sequentially formed through those processes.

Figure 3:
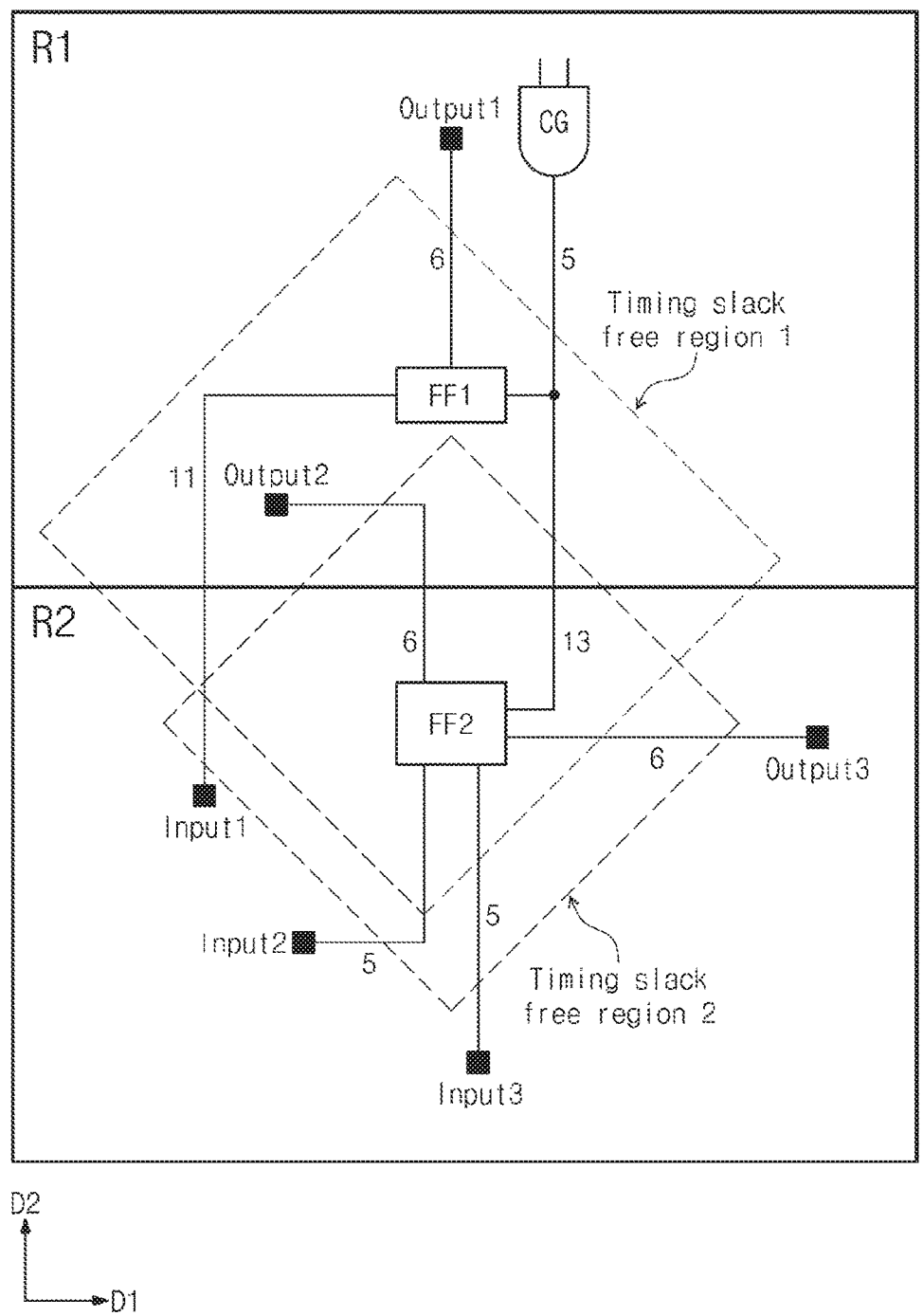
FIG. 3 is a view illustrating a layout of a semiconductor device constituted by a clock gating cell and flip-flops.

FIG. 3 is a view illustrating a layout of a semiconductor device constituted by a clock gating cell and flip-flops. This view illustrates a layout configured before a clumping operation is performed on flip-flops.

A layout illustrated in FIG. 3 is divided into a first region R1 and a second region R2. The regions (R1, R2) illustrated in FIG. 3 may be arbitrary, certain, or particular areas divided by a layout design tool in the process of designing a layout. The regions (R1, R2) may be areas set in consideration of the integration, resolution, etc. of a semiconductor process by a semiconductor manufacturer. A clock gating cell (CG) and flip-flops (FF1, FF2) are illustrated in FIG. 3. For example, it is assumed that a first flip-flop FF1 is a single flip-flop and a second flip-flop is a 2-bit flip-flop. In a semiconductor layout, it is illustrated that a line through which a signal between devices is transmitted is arranged along a first direction D1 and/or a second direction D2. This is merely illustrative and a line which connects devices may be arranged along a third direction.

The clock gating cell may perform a logical operation on a source clock (not shown) or a clock received from other clock gating cell (not shown) and may transmit a result of the logical operation to the first flip-flop FF1. A length of a clock line through which a clock is transmitted from the clock gating cell to the first flip-flop FF1 is shown as 5. A length of a clock line through which a clock is transmitted from the clock gating cell to the second flip-flop FF2 is shown as 13.

The first flip-flop FF1 may perform a logical operation on an input signal received from a first input (Input 1) using a clock and may output a result of the logical operation to a first output (Output 1). The first input (Input 1) and the first output (Output 1) may be actually various logical devices. A length of a signal line through which a first input signal from the first input (Input 1) is transmitted is shown as 11, and a length of a signal line through which a first output signal is output to the first output (Output 1) is shown as 6.

The second flip-flop FF2 may store an input signal received from second and third inputs (Input 2, Input 3) using a clock and may transmit the stored input signal to second and third outputs (Output 2, Output 3) in a next clock cycle. A length of a signal line through which a second input signal from the second input (Input 2) is transmitted is shown as 5 and a length of a signal line through which a second output signal is output to the second output (Output 2) is shown as 6. A length of a signal line through which a third input signal from the third input (Input 3) is transmitted is shown as 5 and a length of a signal line through which a third output signal is output to the third output (Output 3) is shown as 6.

Figure 4:
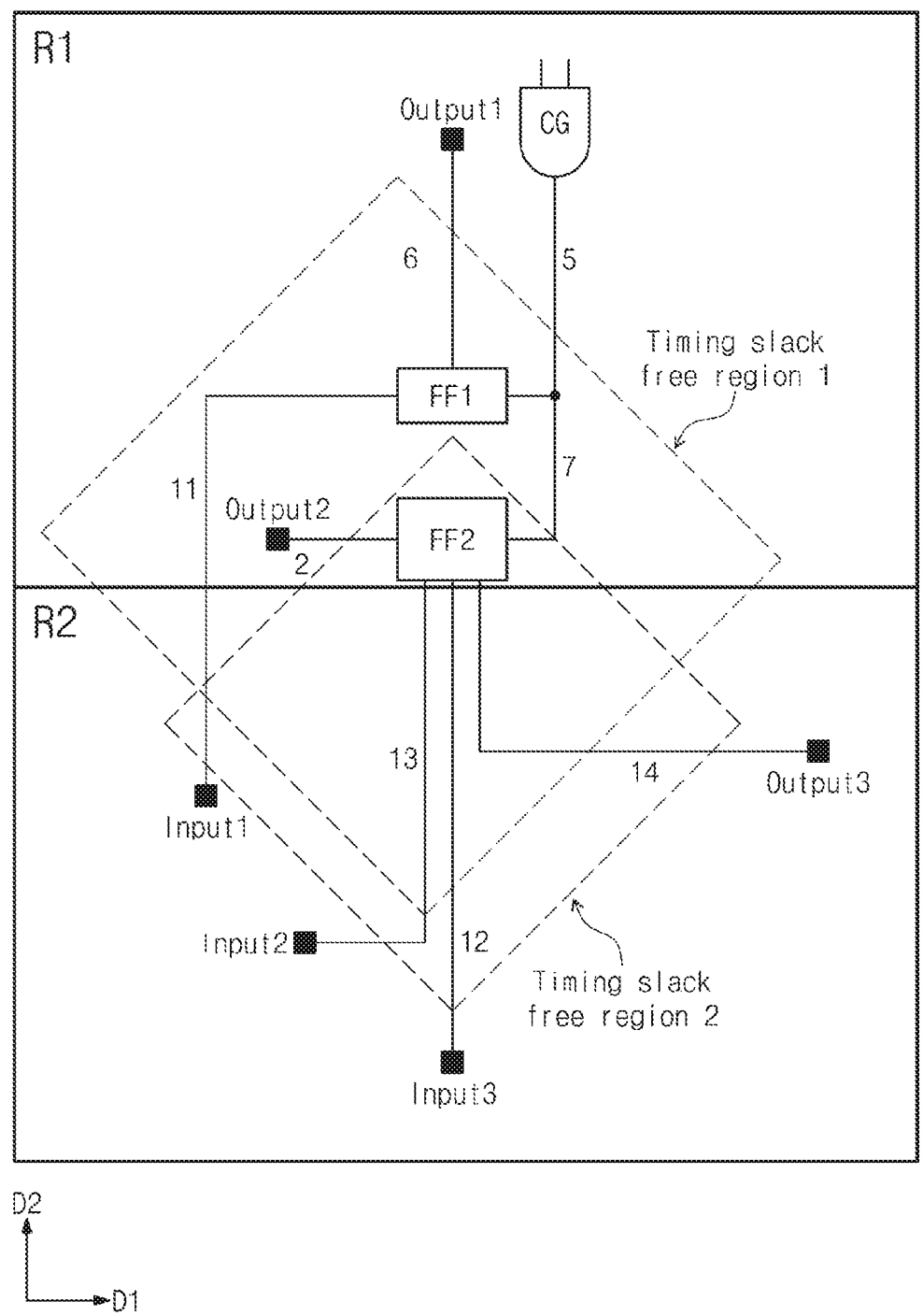
FIG. 4 is a view illustrating an example of performing a clumping operation with respect to flip-flops illustrated in FIG. 3.

FIG. 4 is a view illustrating an example of performing a clumping operation with respect to the flip-flops illustrated in FIG. 3. In FIG. 4, the clumping operation is performed on only the second flip-flop FF2 and as a result of performing the clumping operation, a distance between the second flip-flop FF2 and the clock gating cell (CG) is reduced.

When the clumping operation is performed, each flip-flop has to be arranged within a range where timing slack does not occur. That is, an operation timing of the flip-flop should not be off, or the flip-flop should not operate incorrectly due to the clumping operation. In the drawing, a region in which the first flip-flop FF1 can move is illustrated by a first timing slack free region 1, and a region in which the second flip-flop FF2 can move is illustrated by a second timing slack free region 2.

By performing a clumping operation on the second flip-flop FF2, the length of the clock line connected to the second flip-flop FF2 is changed to 7 and lengths of second and third input lines are changed to 12 and 13 respectively and lengths of second and third output lines are changed to 2 and 14 respectively.

A mathematical formula 1 below may be considered to check whether a clumping operation with respect to the second flip-flop FF2 is suited from the viewpoint of power consumption. That is, only when the mathematical formula 1 below is satisfied, a clumping operation with respect to the second flip-flop FF2 may be performed. The mathematical formula 1 below is referred to as a cost function.

$$\frac{\Delta A * SwitchingActivity_A}{\Delta B * SwitchingActivity_B} < T \quad \text{[mathematical formula 1]}$$

Here, $\Delta A$ is the increment of a length of a signal line and $\Delta B$ is the decrement of a length of a clock line. Switching Activity$_A$ is an activity (i.e., the number of toggles per unit time) of a signal which is input to a flip-flop or is output from the flip-flop through the signal line, and Switching Activity$_B$ is an activity of a clock which is input to the flip-flop through the clock line. It is assumed that the activity of the signal is 1 and the activity of the clock is 2. The T is a user specific parameter and is a constant set by a memory vendor when designing a layout. The T may be decided by various factors such as activity of a clock, activity of a signal, the amount of capacitance change according to a change of a length of a clock line and a signal line, whether a flip-flop is a multi-bit flip-flop, device density, a clock skew, etc. For brevity of description, it is assumed that T is 1.

According to the mathematical formula 1, in the case of the first flip-flop FF1, the amount of change of the length of the signal line and the amount of change of the length of the clock line are 0. In the case of the second flip-flop FF2, the increment ($\Delta A$) of the length of the signal lines is (13−5)+(12−5)+(14−6)+(2−6)=19, and the decrement ($\Delta B$) of the length of the clock line is 6. If these values are substituted into the mathematical formula 1, the result is (19*1)/(6*2) <1, which is not valid. This means that the increment of power consumption according to an increase of the length of the signal line is greater than the decrement of power consumption according to a reduction of the length of the clock line. Thus, a clumping operation with respect to the second flip-flop FF2 such as illustrated in FIG. 4 is inappropriate.

Figure 5:
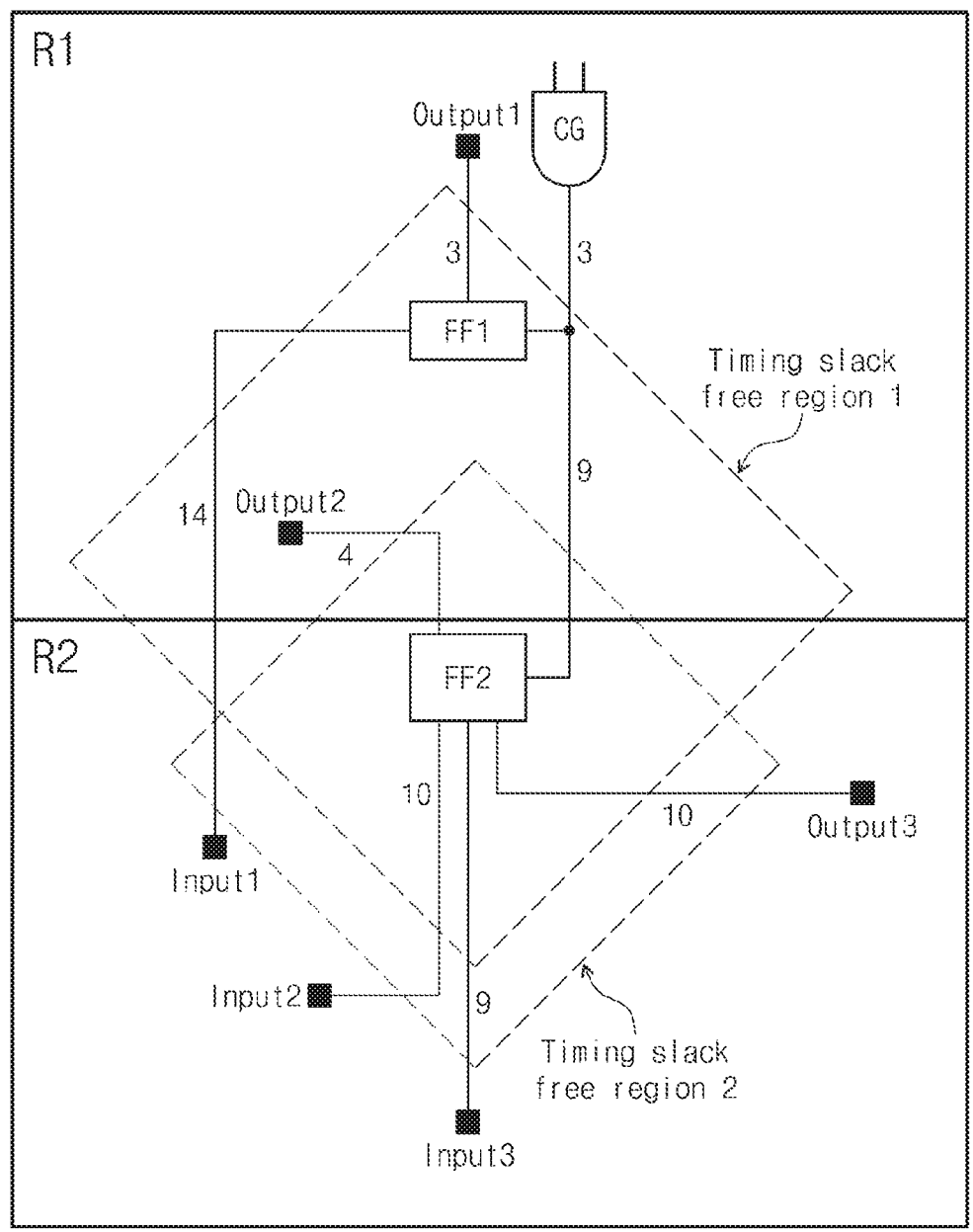
FIG. 5 is a view illustrating another example of performing a clumping operation with respect to flip-flops illustrated in FIG. 3.

FIG. 5 is a view illustrating another example of performing a clumping operation with respect to flip-flops illustrated in FIG. 3. In the present embodiment, unlike the embodiment illustrated in FIG. 4, a clumping operation is performed on the first flip-flop FF1 and the second flip-flop FF2.

According to the mathematical formula 1, in the case of the first flip-flop FF1, the increment ($\Delta A$) of the length of the signal line is (14−11)+(3−6)=0 and the decrement ($\Delta B$) of the length of the clock line is 5−3=2. In the case of the second flip-flop FF2, the increment ($\Delta A$) of the length of the signal line is (10−5)+(9−5)+(10−6)+(4−6)=11 and the decrement ($\Delta B$) of the length of the clock line is 13−9=4. If substituting the calculated value with respect to the first flip-flop FF1 and the second flip-flop FF2 into the mathematical formula 1, {(0+11)*1}/{(2+4)*2}<1 which is valid. This means that the decrement of power consumption according to a reduction of the length of the clock line is greater than the increment of power consumption according to an increase of the length of the signal line. Thus, there is an advantage in performing the clumping operation.

In FIGS. 3 through 5, examples of performing a clumping operation through one clock gating cell and two flip-flops were described. Performing a clumping operation with respect to a plurality of flip-flops according to example embodiments of the inventive concept may be understood to minimize a mathematical formula 2 below. In the mathematical formula 2, a coordinate of a clock gating cell (Ci) among a plurality of clock gating cells ($I_1$ to $I_m$) is ($XI_i$, $YI_1$). A coordinate of a flip-flop ($F_j$) among a plurality of flip-flops ($F_1$ to $F_n$) is ($XF_j$, $YF_j$).

$$\sum_{i=1}^{m}\sum_{F_j=C_i}(|XF_j - XI_i| + |YF_j - YI_i|) \quad \text{[mathematical formula 2]}$$

To calculate the increment of a length of the signal line of the mathematical formula 1, a length of the signal line before the clumping operation and a length of the signal line after the clumping operation have to be known. The length of the signal line before the clumping operation and the length of the signal line after the clumping may be expressed by a mathematical formula 3 and a mathematical formula 4 respectively.

$$SWO_{kj} = \sum_{k=1}^{p}SW_k(|XC_k - XFO_j| + |YC_k - YFO_j|) \quad \text{[mathematical formula 3]}$$

$$SWC_{kj} = \sum_{k=1}^{p}SW_k(|XC_k - XFC_j| + |YC_k - YFC_j|) \quad \text{[mathematical formula 4]}$$

Here, a coordinate of the flip-flop (Fj) before the clumping operation is ($XFO_j$, $YFO_j$) and a coordinate of the flip-flop (Fj) after the clumping operation is ($XFC_j$, $YFC_j$). a coordinate (e.g., a coordinate of an input 3 of FIG. 5) of any one ($C_k$) of input/outputs ($C_1$ to $C_p$) of a signal which is input to the flip-flop ($F_j$) or output from the flip-flop ($F_j$) is ($XC_K$, $YC_K$). $SW_k$ is the switching activity of the signal.

To calculate the decrement of a length of the clock line of the mathematical formula 1, a length of the clock line of before the clumping operation and a length of the clock line of after the clumping operation have to be known. The length of the clock line of before the clumping operation and the length of the clock line of after the clumping operation may be expressed by a mathematical formula 5 and a mathematical formula 6 respectively.

[mathematical formula 5]

$$CWO_k = CW_j(|XFO_j - XI_i| + |YFO_j - YI_i|)$$

[mathematical formula 6]

$$CWC_k = CW_j(|XFC_j - XI_i| + |YFC_j - YI_i|)$$

Here, $CW_j$ is the switching activity of the clock.

The mathematical formula 1 may be expressed by a mathematical formula 7 considering the mathematical formulas 2 through 6. The numerator of the mathematical formula 7 is the product of the switching activity of the signal and the increment of the length of the signal line and the denominator of the mathematical formula 7 is the product of the switching activity of the clock and the decrement of the length of the clock line.

$$\frac{SWC_{kj} - SWO_{kj}}{|CWC_k - CWO_k|} < T \qquad \text{[mathematical formula 7]}$$

In addition to whether the flop-flop is in a timing slack free area or not, a change of the length of the clock line, and a change of the length of the signal line, when performing a clumping operation, the following additional factors may be taken into account.

In the case where an area of logical devices arranged in a specific area exceeds a critical value, the clumping operation may not be performed. That is, when performing the clumping operation, the density of the devices may be additionally taken into account. A specific area may not be full of logical devices, and there should be some empty spaces considering needs for a spare cell, routing, etc. This condition may be expressed by a mathematical formula 8 below.

$$\frac{A_F + A_C}{W * H} \leq D_{max} \qquad \text{[mathematical formula 8]}$$

Here, $A_F$ is an area of flip-flops arranged in a specific region (e.g., R1, R2 of FIGS. 3 to 5) and $A_C$ is an area of logical devices (e.g., CG of FIGS. 3 to 5). W is the length of each region (R1 or R2) along a first direction D1, and H is the height of each region (R1 or R2) along a second direction D2. $D_{max}$ is the maximum allowed density of the area.

In addition, if a clock skew goes beyond a critical value (e.g., a range in which a logical device may malfunction), the clumping operation may not be executed. This condition may be expressed by a mathematical formula 9 below.

[mathematical formula 9]

$$|D_S - D_l| \leq S_{max}$$

Here, $D_s$ is the shortest distance between a source clock and a flip-flop and $D_l$ is the longest distance between the source clock and the flip-flop, and $S_{max}$ is a maximum allowed clock skew.

Figure 6:
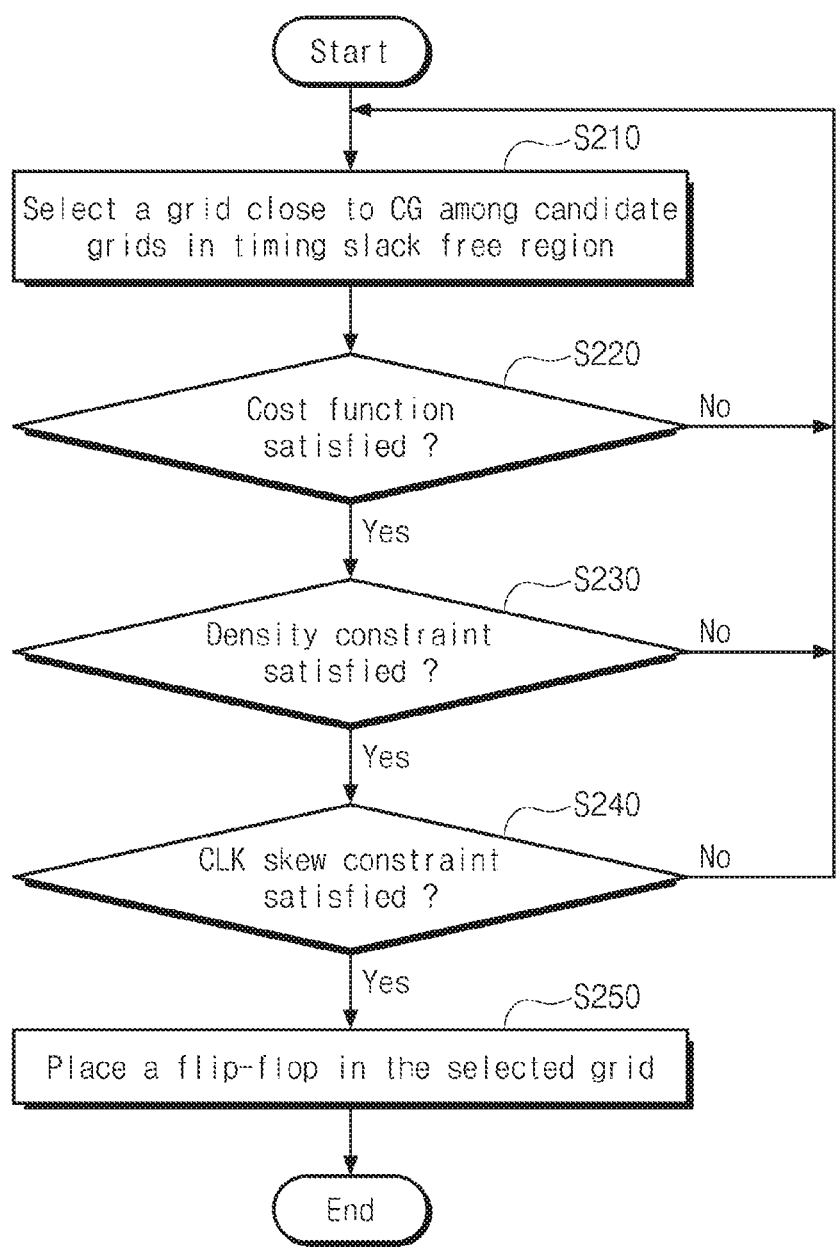
FIG. 6 is a flowchart illustrating a method of laying out a semiconductor device according to example embodiments.

FIG. 6 is a flowchart illustrating a method of laying out a semiconductor device according to example embodiments. In particular, FIG. 6 illustrates an example embodiment of an operation that may be performed on a newly changed location on a layout according to a clumping operation with respect to the flip-flops (FF1, FF2). The location of a flip-flop newly changed through the clumping operation is referred to as a target location. To facilitate a better understanding, FIG. 6 will be described with reference to FIG. 5.

In an operation S210, a flip-flop is arranged within a timing slack free area (for example, any one of a plurality of grids). Even though power consumption is reduced by arranging the flip-flop at the target location, if the flip-flop is arranged outside the timing slack free area, a semiconductor device malfunctions. Thus, the first flip-flop FF1 is arranged at a location near the gating cell within the first slack free area.

In an operation S220, as a result of change to the target location, it may be determined whether a cost function condition is satisfied. For example, the cost function was described in detail through the mathematical formula 1. That is, as the flip-flop moves to the target location, a reduction of power consumption due to a reduction of a length of the clock line and an increase of power consumption due to an increase of a length of the signal line are properly compared with each other in consideration of the switching activity. If the cost function condition is not satisfied, then operation S210 is executed again and it may be determined whether a clumping operation with respect to the next closest target location to the gating cell is proper. If the cost function condition is satisfied, then an operation S230 is executed.

In operation S230, it may be determined whether a density condition of devices is satisfied. For example, as the flip-flop moves to the target location, if the device density does not satisfy the requirement of the mathematical formula 8, then operation S210 is executed again and it may be determined whether a clumping operation with respect to another target location is proper. If the density condition of devices is satisfied, then an operation S240 is executed.

In operation S240, it may be determined whether a clock skew condition is satisfied. For example, as the flip-flop moves to the target location, if the clock skew condition does not satisfy the requirement of the mathematical formula 9, then operation S210 is executed again and it may be determined whether a clumping operation with respect to another target location is proper. If the clock skew condition is satisfied, then an operation S250 is executed.

In operation S250, if all the conditions in the operations described above are satisfied, then the flip-flop may be arranged at the target location. That is, power consumption of a semiconductor device may be reduced without malfunction of logical devices by disposing the flip-flop at the target location.

The operations described above may be repeatedly executed with respect to all the places (or coordinates) in which the flip-flop can be arranged in one region (e.g., R1 or R2). Thus, it may be determined whether all the conditions in the operations described above are satisfied with respect to the target location closest to the gating cell within one region (e.g., R1 or R2) and if all the conditions are not satisfied, it may be determined whether all the conditions in the operations described above are satisfied with respect to the target location second closest to the gating cell. That is, the operations described above may be repeatedly executed until all the conditions are satisfied. In this case, the flip-flop may be arranged at the place that can minimize power consumed in a clock line of the flip-flop while satisfying all the conditions described above (e.g., a device density condition and a clock skew condition).

In the embodiment, it is described that each operation is executed in a particular order. This is merely illustrative. For example, in other embodiments, operation S230 may be performed earlier than operation S220, or operation S240 may be performed earlier than the operation S220, etc.

Examples of performing a clumping operation with respect to the flip-flop(s) considering the switching activity were described above through FIGS. 1 through 6. Even in the case where a gating device is inserted into a semiconductor layout to perform a smooth test when a semiconductor device enters a test mode, the switching activity described above may be taken into account.

Figure 7:
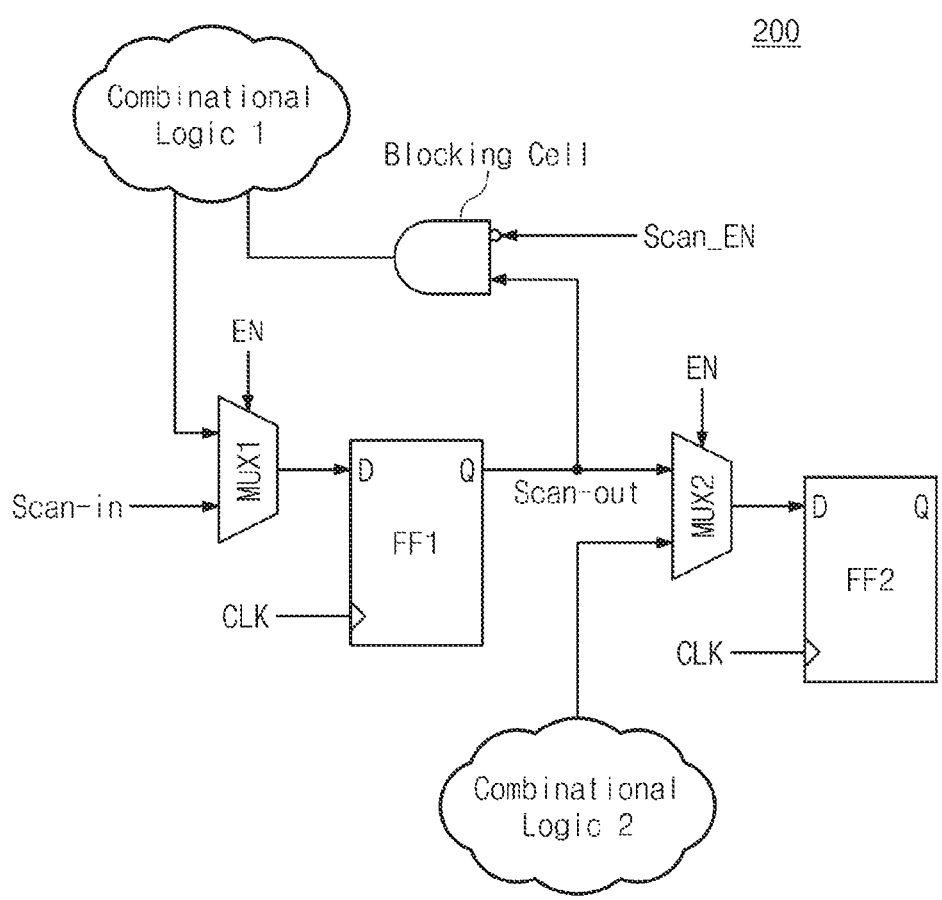
FIG. 7 is a circuit diagram illustrating a semiconductor device according to example embodiments.

FIG. 7 is a circuit diagram illustrating a semiconductor device 200 according to example embodiments. Semiconductor device 200 may include first and second flip-flops (FF1, FF2), first and second multiplexers (MUX1, MUX2), first and second combination logic blocks 1 and 2, and a blocking cell. Various other configurations of semiconductor devices are of course possible, but the circuit diagram of FIG. 7 is provided as an example. Also, the blocking cell is illustrated in FIG. 7 as an AND gate, but embodiments are not limited thereto.

A semiconductor device may have two operation modes. One is a functional mode (or normal mode) of performing a general function of the semiconductor device and the other is a scan shift test mode of performing a test with respect to the semiconductor device.

When performing a test with respect to the semiconductor device 200, it is required to test whether there is a problem in the flip-flops (FF1, FF2) included in semiconductor device 200. However, it is difficult to find a specific flip-flop having a problem in a circuit diagram in which various logical devices and flip-flops are complicatedly intertwined with one another. To this end, the flip-flops are connected to one another, and the flip-flops and other combinational logic blocks are blocked to prevent them from exchanging a signal. The blocking cell is used in this case. A location at which the blocking cell is inserted may be properly considered when designing a layout of the semiconductor device.

In the functional mode, semiconductor device 200 may include a configuration where an output signal from the first flip-flop FF1 is input to the first combinational logic block 1. To this end, the blocking cell may properly operate. A signal from the second combinational logic block 2 may be input to the second flip-flop FF2. To this end, the second multiplexer MUX2 may properly operate.

In the scan shift test mode, the blocking cell may be activated by a scan enable signal (Scan_EN) and as a result, a signal output from the first flip-flop FF1 is not input to the first combinational logic block 1. The second multiplexer MUX2 is activated instead by the scan enable signal (Scan_EN) and thereby the first flip-flop FF1 and the second flip-flop FF2 may be connected to each other.

In the scan shift test mode, a signal from the second combinational logic block 2 is not input to the second flip-flop FF2. Thus, an additional blocking cell is needed. However, since in the present embodiment, a connection of the first flip-flop FF1 to the second flip-flop FF2, and a block between the first flip-flop FF1 and the first combinational logic are described, a description of a blocking cell to block out the second combinational logic block 2 and the second flip-flop FF2 is omitted. Since a scan-in signal which is input to the first multiplexer MUX1 is a signal received from another flip-flop (not shown), a description thereof is omitted.

According to example embodiments, it may be determined whether a blocking cell is inserted in consideration of the switching activity in the functional mode and the switching activity in the scan shift test mode of semiconductor device 200. It may also be determined whether a blocking cell is inserted in consideration of the number of loads connected to an output stage. An example of determining whether to insert a blocking cell considering all those factors is illustrated in FIGS. 8A, 8B, 9A and 9B.

Figure 8A:
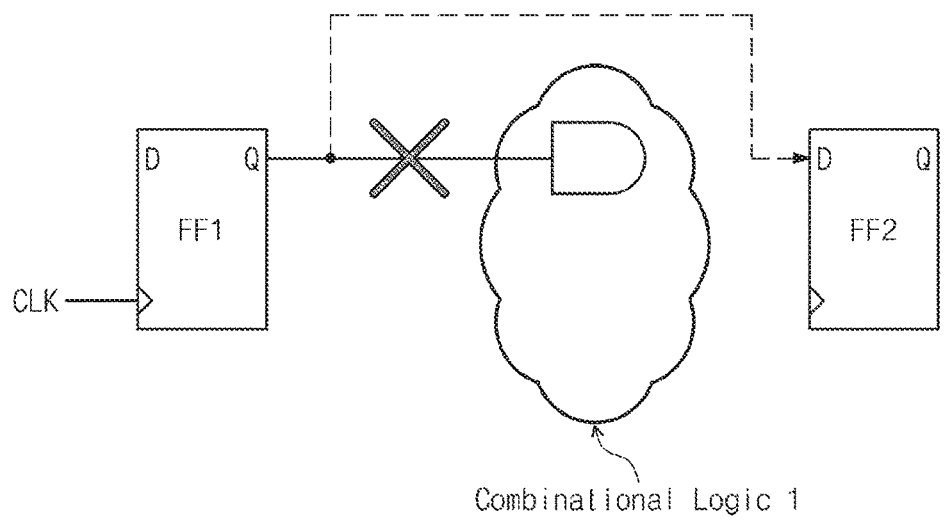
FIG. 8A is a view illustrating an example where flip-flops are connected to one another in a scan shift test mode.
Figure 8B:
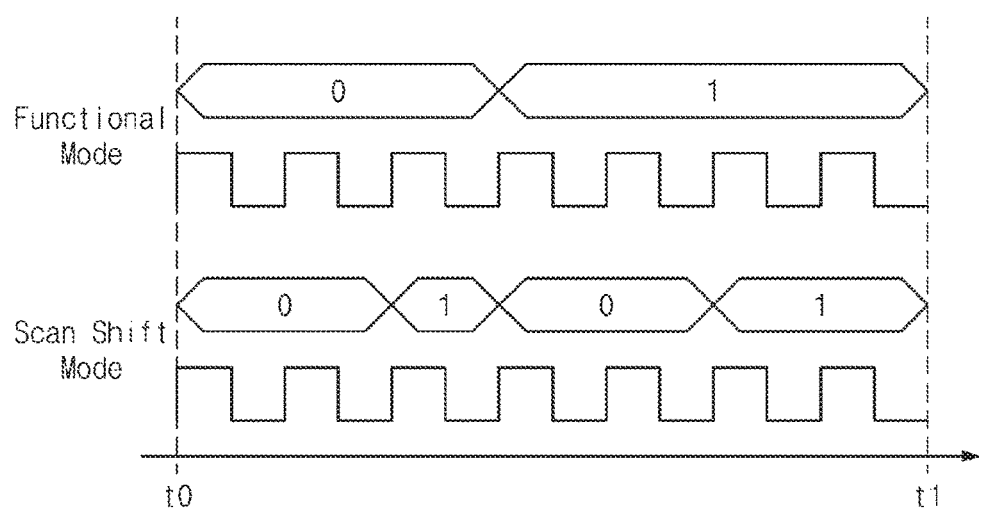
FIG. 8B is a view illustrating a waveform of a signal which is output from a first flip-flop and a waveform of a clock which is input to the first flip-flop in a functional mode and a scan shift test mode.

FIG. 8A is a view illustrating an example where flip-flops are connected to one another in a scan shift test mode. Among the configuration elements of the semiconductor device of FIG. 7, only the first and second flip-flops (FF1, FF2) and the first combinational logic block 1 are briefly illustrated in FIG. 8A. FIG. 8B is a view illustrating a waveform of a signal which is output from a first flip-flop and a waveform of a clock which is input to the first flip-flop in a functional mode and a scan shift test mode. FIGS. 8A and 8B are described together.

In the functional mode, an output from the first flip-flop FF1 is input to the first combinational logic. In the scan shift test mode, a connection of the first flip-flop FF1 to the first combinational logic is blocked and the first flip-flop FF1 is connected to the second flip-flop FF2.

Activity of a signal output from the first flip-flop FF1 in the functional mode is half the activity of a signal output from the second flip-flop FF2 in the scan shift test mode. This may be known by comparing the number of times of toggles in a reference cycle (e.g., t0 to t1).

Since the switching activity in the scan shift test mode is greater than the switching activity in the functional mode, even though it may seem proper to insert a blocking cell for disconnecting a connection of the first flip-flop FF1 to the first combinational logic block 1 and connecting the first flip-flop FF1 and the second flip-flop FF2, this may be ineffective considering the number of loads connected to an output stage of the first flip-flop FF1. Since only one AND gate is connected to the output stage of the first flip-flop FF1, reducing power consumption by one AND gate may fall short of expectations.

Figure 9A:
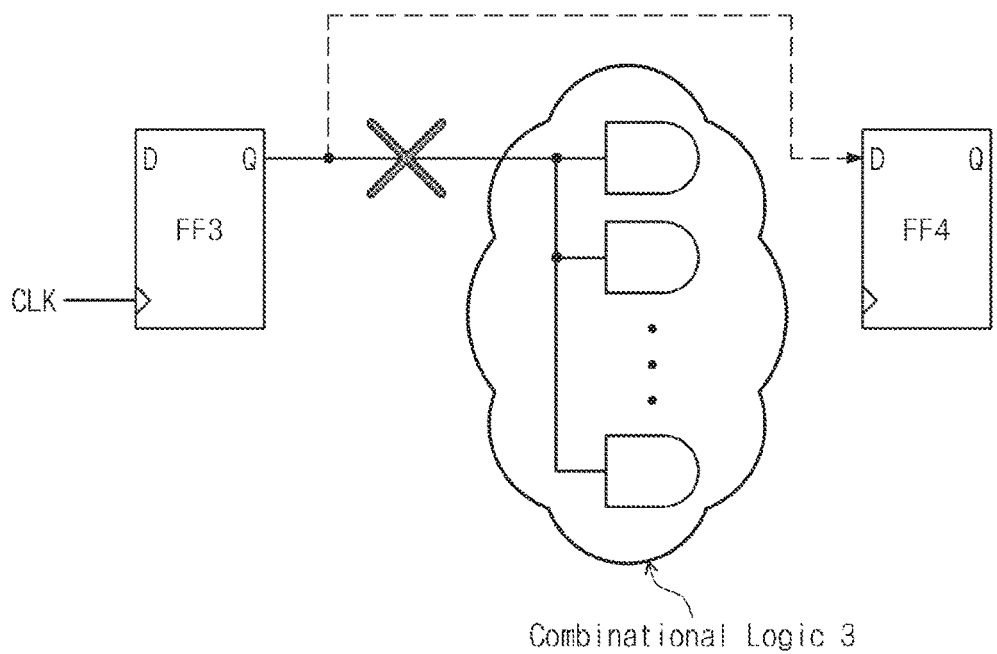
FIG. 9A is a view is a view illustrating an example where flip-flops are connected to one another in a scan shift test mode.
Figure 9B:
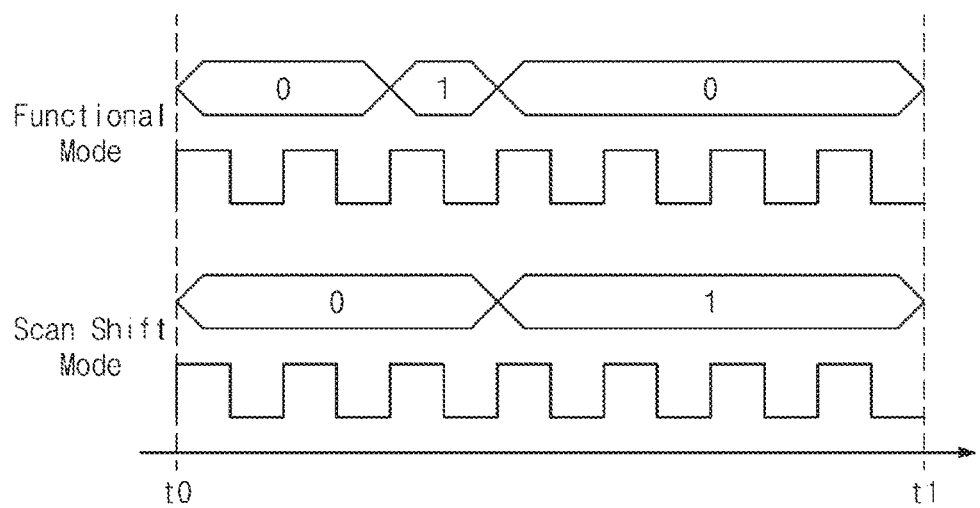
FIG. 9B is a view illustrating a waveform of a signal which is output from a third flip-flop and a waveform of a clock which is input to the third flip-flop in a functional mode and a scan shift test mode.

FIG. 9A is a view is a view illustrating another example where flip-flops are connected to one another in a scan shift test mode. Only third and fourth flip-flops (FF3, FF4) corresponding to the first and second flip-flops (FF1, FF2) respectively and a third combination logic 3 corresponding to the first combinational logic are briefly illustrated in FIG. 9A. Here, it is assumed that the third combinational logic includes 10 AND gates. FIG. 9B is a view illustrating a waveform of a signal which is output from the third flip-flop and a waveform of a clock which is input to the third flip-flop in the functional mode and the scan shift test mode. FIGS. 9A and 9B are described together.

In the functional mode, an output of the third flip-flop FF3 is input to the third combinational logic 3. In the scan shift test mode, a connection of the third flip-flop FF3 to the third combinational logic 3 is blocked and the third flip-flop FF3 and the fourth flip-flop FF4 are connected to each other.

Activity of a signal output from the third flip-flop FF3 in the functional mode is two times the activity of a signal output from the fourth flip-flop FF4 in the scan shift test mode. This may be known by comparing the number of times of toggles in a reference cycle (e.g., t0 to t1).

Since the switching activity in the functional mode is greater than the switching activity in the scan shift test mode, even though it may seem improper to insert a blocking cell for disconnecting a connection of the third flip-flop FF3 to the third combinational logic and connecting the third flip-flop FF3 and the fourth flip-flop FF4, this may be effective considering the number of loads connected to an output stage of the third flip-flop FF3. Since ten AND gates are connected to the output stage of the third flip-flop FF3, reducing power consumption by ten AND gates has an advantage from the viewpoint of power consumption as compared with the example of FIGS. 8A and 8B.

According to example embodiments, when inserting a blocking cell for connecting flip-flops in the scan shift test mode, not only the switching activity in the scan shift test mode and the switching activity in the functional mode, but also the number of loads connected to an output of the flip-flops are taken into account together. This may be expressed by a mathematical formula 10 below. In the case where the mathematical formula 10 is satisfied, a blocking cell may be inserted.

$$\text{Cost}_i = \frac{F_i}{S_i * n_{fanout}} \leq T \qquad \text{[mathematical formula 10]}$$

Here, the $F_i$ is a switching activity of a signal output from a flip-flop in the functional mode and the $S_i$ is a switching activity of a signal output from the flip-flop in the scan shift test mode. The variable $n_{fanout}$ is the number of loads driven by the flip-flop in the functional mode, that is, the number of loads connected to an output stage of the flip-flop in the functional mode. T is a user specific parameter and is a constant set by a designer when inserting a blocking cell. The constant value may be determined depending on where a weight is assigned between power consumed in the functional mode and power consumed in the scan shift test mode.

Besides the condition of the mathematical formula 10, various factors may be further considered when inserting a blocking cell. For example, if a signal delay which exceeds a critical value occurs due to an insertion of the blocking cell, this may cause an error when performing a test operation with respect to the semiconductor device. That is, a setup slack timing should be greater than 0. Thus, when inserting the blocking cell, a mathematical formula 11 below may be further considered.

[mathematical formula 11]

$$\text{Setupslack} = T_{CLK} - T_{scansetup} - T_{comb} - T_{CKQ} - T_{gating} - T_{unc} \geq 0$$

Here, the $T_{CLK}$ is a cycle of a clock, the $T_{scansetup}$ is a setup time of a blocking cell and the $T_{comb}$ is a path delay of a combinational logic block. The $T_{CKQ}$ is a propagation delay from a clock of the blocking cell to an output after a positive clock edge. The $T_{gating}$ is a delay due to an insertion of the blocking cell and the $T_{unc}$ is a delay due to factors such as a clock skew, jitter, etc.

Besides the condition of the mathematical formula 11, in the case where an area of a logical device arranged in a specific area on the layout exceeds a critical value, a clumping operation may not be performed. That is, when the blocking cell is inserted, the density of devices may be additionally considered. Since this condition is the same as that expressed by the mathematical formula 8 above, a detail description thereof is omitted.

Figure 10:
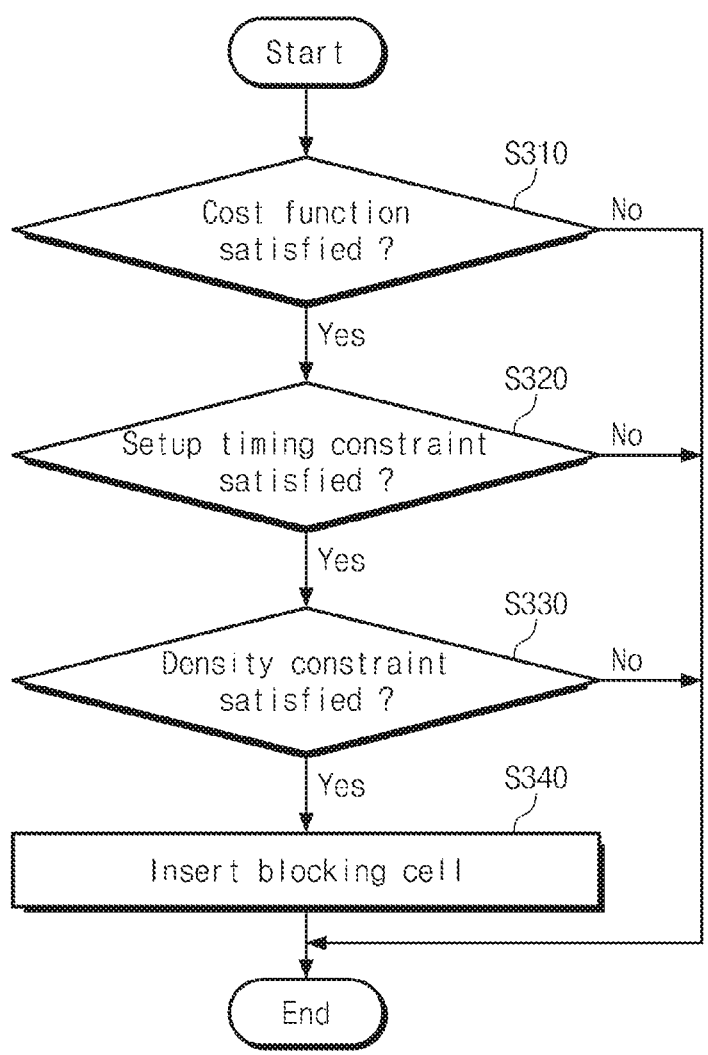
FIG. 10 is a flowchart illustrating a method of laying out a semiconductor device according to example embodiments.

FIG. 10 is a flowchart illustrating a method of laying out a semiconductor device according to example embodiments. In particular, FIG. 10 illustrates an example of a method of inserting a blocking cell that is used to enter a scan shift test mode. To facilitate a better understanding, FIG. 10 will be described with reference to FIG. 7 together.

In an operation S310, it may be determined whether a cost function condition is satisfied according to an insertion of a blocking cell. For example, the cost function of the mathematical formula 10 may be used. That is, not only the switching activity in the functional mode and the switching activity in the scan shift test mode but also the number of loads connected to an output stage of the flip-flop may be considered together. If the cost function condition is not satisfied, since an insertion of the blocking cell with respect to the corresponding flip-flop is improper, the procedure is finished. If the cost function condition is satisfied, then an operation S320 is executed.

In operation S320, it may be determined whether a setup slack timing condition is satisfied. For example, if the setup slack timing becomes less than 0 according to an insertion of the blocking cell, this may cause a delay which causes an error in an operation of the semiconductor device. Thus, if the setup slack timing condition is not satisfied, an insertion of the blocking cell with respect to the corresponding flip-flop is improper, the procedure is finished. If the setup slack timing condition is satisfied, then an operation S330 is executed.

In operation S330, it may be determined whether a density condition of devices is satisfied. For example, as the blocking cell is inserted, since, if the device density condition does not satisfy a requirement of the mathematical formula 8, the insertion of the blocking cell with respect to the corresponding flip-flop is improper, the procedure is finished. If the device density condition satisfies a requirement of the mathematical formula 8, then an operation S340 is executed.

In operation S340, an insertion of the blocking cell is executed. As the blocking cell is inserted, the flip-flop and the combinational logic are blocked in the scan shift test mode and the flip-flop may be connected to other flip-flop.

The order that the operations S310 to S330 are executed is illustrative. That is, the order that each operation is executed is not limited thereto. For example, the operation S320 may be executed before the operation S310, or the operation S330 may be executed before the operation S310 in other embodiments.

Figure 11:
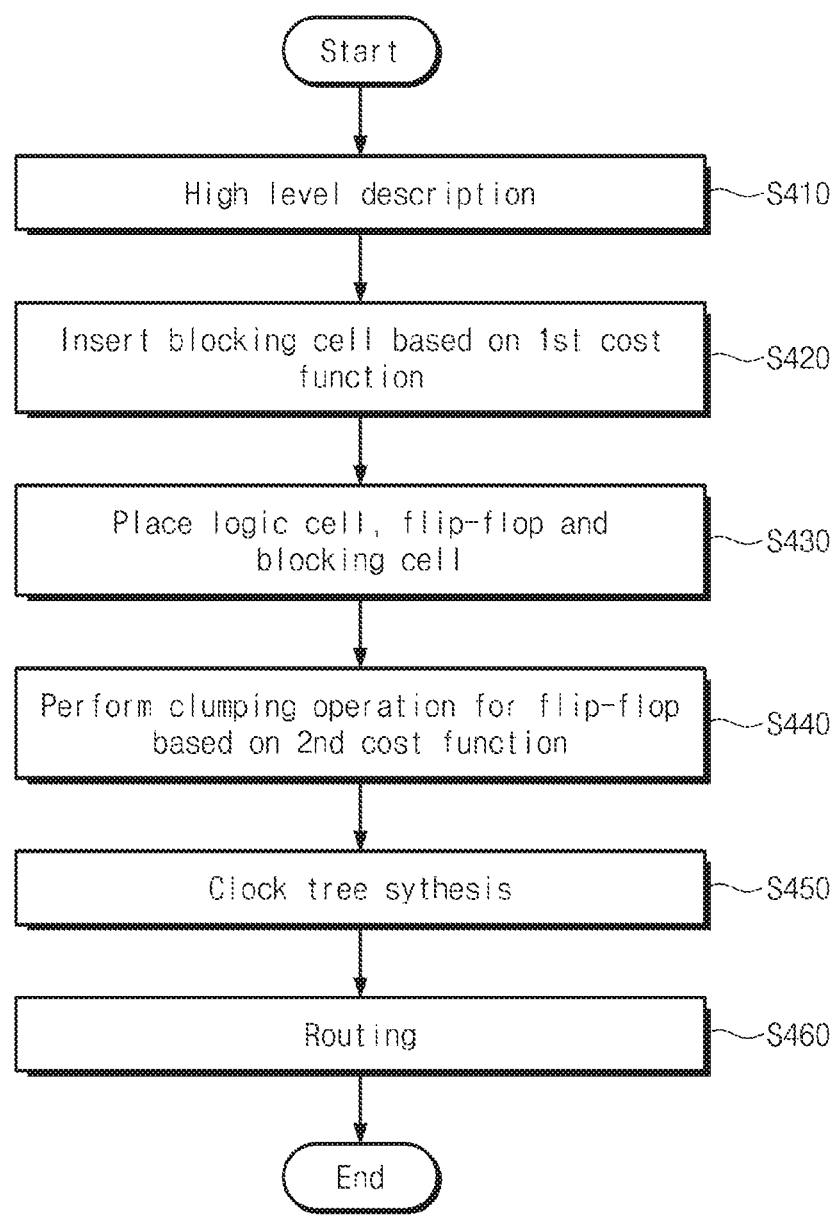
FIG. 11 is a flowchart illustrating a method of designing and manufacturing a semiconductor device according to example embodiments.

FIG. 11 is a flowchart illustrating a method of designing and manufacturing a semiconductor device according to example embodiments.

In an operation S410, a high level design of a semiconductor device may be performed using computing system 100 of FIG. 1. Circuits designed by the high level design may be more specifically expressed by a register transfer level (RTL) coding or a simulation and may be converted into a netlist to be synthesized with the whole semiconductor device.

In an operation S420, a blocking cell may be inserted based on a first cost function. The first cost function may be the mathematical formula 10. In connection with a flip-flop into which the blocking cell is inserted, it may be determined whether inserting the blocking cell is appropriate in consideration of various factors such as switching activity in a functional mode, switching activity in a scan shift test mode, the number of loads connected to an output stage of the flip-flop, etc.

Besides the cost function, the density condition expressed in the mathematical formula 8 and the slack setup timing condition included in a layout of the semiconductor device which is expressed in the mathematical formula 11 may be additionally considered.

In an operation S430, logic cells, flip-flops, and blocking cells may be arranged on a virtual layout. For example, various standard cells, flip-flops, and blocking cells provided from a cell library may be arranged according to a prescribed design rule with reference to a schematic circuit synthesized in the high level design or a netlist corresponding thereto.

In an operation S440, a clumping operation with respect to a flip-flop may be performed based on a second cost function. The second cost function may be the mathematical formula 1. That is, in connection with a flip-flop rearranged on a layout of the semiconductor device, the flip-flop may be arranged at a position where power consumption of the semiconductor device is reduced in consideration of the increment of a length of a signal line, the decrement of a length of a clock line, the switching activity of the signal, the switching activity of the clock, the timing slack, the density of a device, the clock skew, etc.

In an operation S450, a clock tree may be synthesized to reduce power consumption by a clock tree network.

In an operation S460, a routing that connects devices arranged on a layout of the semiconductor device may be executed.

According to example embodiments, since a semiconductor device is arranged considering switching activity with respect to the semiconductor device, power consumption by a clock and a signal may be reduced.

According to example embodiments, since a blocking cell is arranged considering switching activity in a scan shift test mode and switching activity in a functional mode, power consumption due to an insertion of the blocking cell may be reduced.

The contents described above are specific embodiments for implementing one or more aspects of the inventive concept. The inventive concept may include not only the embodiments described above but also embodiments in which a design is simply or easily capable of being changed. The inventive concept may also include technologies easily changed to be implemented using embodiments.

What is claimed is:

1. A layout method of a semiconductor device, the method comprising:
   arranging in the semiconductor device a flip-flop which is configured to receive a clock through a clock line, to receive an input signal through an input line, and to output an output signal through an output line; and
   rearranging the flip-flop to a location in the semiconductor device based on a length of the clock line, a number of times the clock is toggled per reference time, a length of the input line, a length of the output line, and at least one of: a number of times that the input signal is toggled per the reference time, and a number of times that the output signal is toggled per the reference time.

2. The method of claim 1, further comprising rearranging the flip-flop based on a ratio of a combined area of: (1) a clock gating cell, which generates the clock, and (2) the flip-flop, to a reference area.

3. The method of claim 2, further comprising rearranging the flip-flop based on clock skew which varies according to a location of the flip-flop.

4. The method of claim 1, further comprising rearranging the flip-flop based on whether the flip-flop stores multi-bit data.

5. The method of claim 1, wherein the flip-flop is a first flip-flop, the method further comprising:
   arranging a blocking cell configured to selectively block a connection between an output stage of the first flip-flop and a combinational logic block, and to connect the first flip-flop and a second flip-flop in a scan shift test mode for a test of the semiconductor device.

6. The method of claim 5, wherein the arranging the blocking cell is executed in consideration of: at least one of:
   a number of times that the input signal with respect to the first flip-flop is toggled per reference time, and a number of times that the output signal with respect to the first flip-flop is toggled per reference time, in a functional mode;
   at least one of: a number of times that the input signal with respect to the first flip-flop is toggled per the reference time, and a number of times that the output signal with respect to the first flip-flop is toggled per the reference time, in the scan shift test mode; and
   a number of loads connected to an output stage of the first flip-flop in the functional mode.

7. The method of claim 6, wherein the blocking cell is arranged when a ratio of the number of times at least one of the input signal and the output signal with respect to the first flip-flop is toggled per reference time in the functional mode, to a product of: (1) the number of times at least one of the input signal and the output signal with respect to the first flip-flop is toggled per the reference time in the scan shift test mode, and (2) the number of loads, is less than a reference value.

8. The method of claim 6, wherein in arranging the blocking cell, a setup slack timing according to an insertion of the blocking cell is considered.

9. The method of claim 6, wherein in arranging the blocking cell, a ratio of an area of a clock gating cell, an area of the flip-flop, and an area of the blocking cell to the reference area is considered.

10. A semiconductor device, comprising:
    a clock gating cell; and
    a flip-flop configured to receive a clock from the clock gating cell through a clock line, to receive an input signal through an input line, and to output an output signal through an output line,
    wherein the flip-flop is arranged at a location in the semiconductor device selected based on a length of the clock line, a number of times the clock is toggled per reference time, a length of the input line, a length of the output line, and at least one of: a number of times that the input signal is toggled per the reference time and, and a number of times that the output signal is toggled per the reference time.

11. The semiconductor device of claim 10, wherein the location where the flip-flop is arranged is based on a ratio of a combined area of: (1) the clock gating cell and (2) the flip-flop, to a reference area.

12. The semiconductor device of claim 11, wherein the location where the flip-flop is arranged is based on a clock skew which varies according to an arrangement of the flip-flop.

13. The semiconductor device of claim 10, wherein the location where the flip-flop is arranged is based on whether the flip-flop stores multi-bit data.

14. A semiconductor device, comprising:
    a clock gating cell; and
    a flip-flop configured to receive a clock from the clock gating cell through a clock line, to receive an input signal through an input signal line, and to output an output signal through an output signal line, wherein the flip-flop is disposed at a selected location in the semiconductor device which selected location satisfies all of a set of criteria comprising:

the selected location is disposed within a timing slack free region in the semiconductor device, a device density constraint is satisfied for an area of the semiconductor device which includes the selected location, a clock skew constraint for the clock is satisfied, and moving the flip-flop from another location to the selected location satisfies a cost function which considers a length of the clock line, a number of times the clock line is toggled per reference time, a length of the input signal line, a length of the output signal line, and at least one of: a number of times that the input signal is toggled per the reference time, and a number of times that the output signal is toggled per the reference time.

15. The semiconductor device of claim 14, wherein the selected location is a closest location within the timing slack free region to the clock gating cell which satisfies all of the criteria.

16. The semiconductor device of claim 14, wherein the selected location further satisfies a criterion that moving the flip-flop from the selected location to any other location within the timing slack free region does not satisfy at least one of the criteria.

17. The semiconductor device of claim 14, wherein the flip-flop is a first flip-flop the semiconductor device further comprising:

a second flip-flop;

a combinational logic block; and a blocking cell configured to selectively block a connection between an output stage of the first flip-flop and the combinational logic block, and to connect the first flip-flop and a second flip-flop, in a scan shift test mode for a test of the semiconductor device.

18. The semiconductor device of claim 17, wherein a ratio of the number of times at least one of the input signal and the output signal with respect to the first flip-flop is toggled per reference time in a functional mode, to a product of: (1) the number of times at least one of the input signal and the output signal with respect to the first flip-flop is toggled per the reference time in the scan shift test mode, and (2) the number of loads, is less than a reference value.

19. The semiconductor device of claim 14, wherein the cost function is $$\frac{\Delta A * SwitchingActivity_A}{\Delta B * SwitchingActivity_B} < T,$$

wherein $\Delta A$ is an increment of a total length of the input and output signal lines from the other location to the selected location, $\Delta B$ is a decrement of the length of the clock line from the other location to the selected location, Switching Activity$_A$ is the number of times that the signal lines are toggled per reference time, Switching Activity$_B$ is the number of times the clock line is toggled per the reference time, and T is 1.

20. The semiconductor device of claim 14, wherein the cost function further considers whether the flip-flop stores multi-bit data.

* * * * *